(12) United States Patent
Kang et al.

(10) Patent No.: US 8,278,722 B2
(45) Date of Patent: Oct. 2, 2012

(54) FLAT PANEL DISPLAY DEVICE

(75) Inventors: Tae-Wook Kang, Seongnam-si (KR); Choong-Youl Im, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 1438 days.

(21) Appl. No.: 11/832,873

(22) Filed: Aug. 2, 2007

(65) Prior Publication Data

US 2008/0174584 A1   Jul. 24, 2008

Related U.S. Application Data

(63) Continuation of application No. 10/971,007, filed on Oct. 25, 2004, now Pat. No. 7,332,745.

(30) Foreign Application Priority Data

Nov. 27, 2003   (KR) .................. 10-2003-0085233

(51) Int. Cl.
*H01L 29/66* (2006.01)
*H01L 29/786* (2006.01)
*H01L 21/02* (2006.01)

(52) U.S. Cl. ... 257/390; 257/347; 257/72; 257/E21.413; 257/E29.275; 257/E29.278

(58) Field of Classification Search .................. 257/390, 257/347, 72, E21.413, E29.275, E29.278
See application file for complete search history.

(56) References Cited

U.S. PATENT DOCUMENTS

| 6,509,616 | B2 * | 1/2003 | Yamazaki | 257/390 |
| 6,524,877 | B1 * | 2/2003 | Nakazawa et al. | 438/48 |
| 6,771,328 | B2 * | 8/2004 | Park et al. | 349/42 |
| 2003/0039925 | A1 | 2/2003 | Jang et al. | |
| 2003/0057417 | A1 * | 3/2003 | Lee et al. | 257/40 |
| 2003/0085404 | A1 | 5/2003 | Kim et al. | |
| 2004/0135151 | A1 | 7/2004 | Okamoto et al. | |
| 2004/0227462 | A1 * | 11/2004 | Utsumi et al. | 313/506 |

FOREIGN PATENT DOCUMENTS

| JP | 63-158528 | 7/1988 |
| JP | 02-066870 | 3/1990 |
| JP | 08-180974 | 7/1996 |
| JP | 11-040368 | 2/1999 |
| JP | 2000-349301 | 12/2000 |
| JP | 2001-109397 | 4/2001 |
| JP | 2001-154218 | 6/2001 |

(Continued)

*Primary Examiner* — Telly Green
*Assistant Examiner* — Tsz Chiu
(74) *Attorney, Agent, or Firm* — H.C. Park & Associates, PLC

(57) ABSTRACT

A flat panel display device is disclosed that may include a light-emitting layer portion including a first electrode, a second electrode, and an organic light-emitting layer between the first and second electrodes; at least two thin film transistors for controlling the light-emitting layer portion; a scanning signal line for supplying a scanning signal to the thin film transistor; a data signal line for supplying a data signal to the thin film transistor; a light emitting region having a common power supply line for supplying current to the light-emitting layer portion; and a peripheral common power supply line having at least one curved portion and connected to the common power supply line on a panel of a non-light emitting region except the light emitting region, wherein the common power supply line has a reduced wiring width while maintaining a constant wiring resistance to thereby reduce the total size of the display panel.

17 Claims, 9 Drawing Sheets

FOREIGN PATENT DOCUMENTS

| | | |
|---|---|---|
| JP | 2002-110343 | 4/2002 |
| WO | 9734447 | 9/1997 |
| WO | 00-60907 | 10/2000 |
| WO | 03060858 | 7/2003 |

* cited by examiner

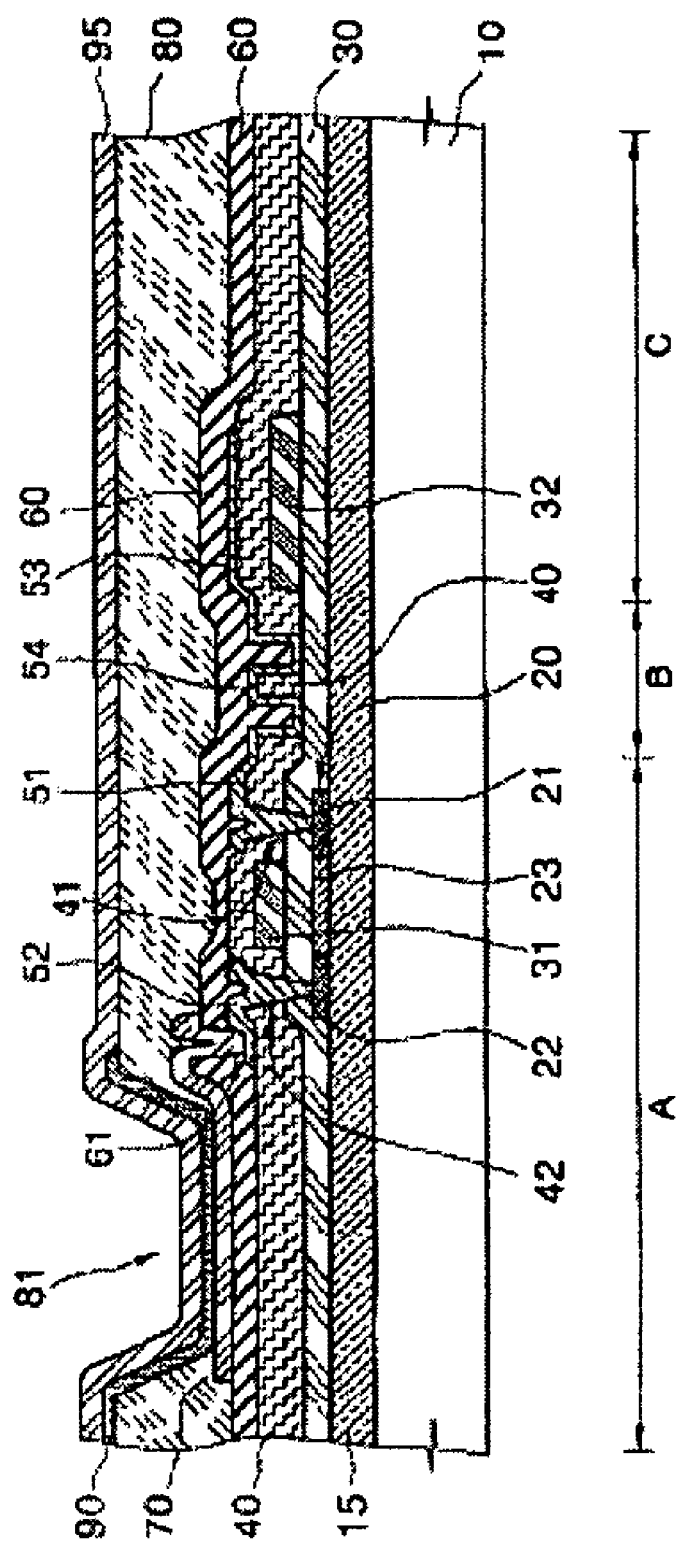

ively formed while the source/drain electrodes 51 and 52 are formed.

FLAT PANEL DISPLAY DEVICE

CROSS-REFERENCE TO RELATED APPLICATION

This application is a continuation of prior application Ser. No. 10/971,007, filed Oct. 25, 2004, and claims priority to and the benefit of Korean Patent Application No. 2003-85233, filed Nov. 27, 2003, both of which are hereby incorporated by reference for all purposes as if fully set forth herein.

BACKGROUND OF THE INVENTION

1. Field of the Invention

The present invention generally relates to a flat panel display device and, more particularly, to a flat panel display device in which both the wiring width of a common power supply line and the panel size may be reduced by allowing the common power supply line (Vdd line) to be constantly curved.

2. Description of the Related Art

FIG. 1A is a schematic plan view of light emitting region and non-light emitting region of an organic electroluminescent (EL) device, and FIG. 1B is a cross-sectional view taken along the line I-I of FIG. 1A for showing a stacked structure of the common power supply line of the organic EL device.

As shown in FIG. 1A, the organic EL device comprises a light emitting region 100 and a non-light emitting region 200, and the non-light emitting region 200 is positioned in a periphery of a panel. A common power supply line 54 is arranged in the non-light emitting region 200 of the periphery of the panel to supply a common voltage to the light emitting region 100.

As shown in FIG. 1B, a buffer layer 15, a gate insulating layer 30, and an interlayer insulating layer 40 may be sequentially stacked. A common power supply line 54 may be arranged on the interlayer insulating layer 40 in the non-light emitting region 200 of the periphery of the panel and formed of the same material as source/drain electrode.

In the related art, a signal line such as a gate line is not formed below the common power supply line 54 in order to prevent an electrical short. Thus the common power supply line 54 is fabricated with a width of about 1.5 mm so as to maintain constant wiring resistance. Consequently the total size of the panel increases.

Furthermore, in the conventional organic EL device, the size of the panel increases due to wiring width of the common power supply line 54 arranged in the light emitting region 100 as well as that of the common power supply line 54 arranged in the non-light emitting region 200 in the periphery of the panel.

FIG. 2A is a plan view for showing a plan structure of the light emitting region of the organic EL device of FIG. 1A, and FIG. 2B is a cross-sectional view taken along the line II-II of FIG. 2A.

As shown in FIG. 2B, the light emitting region of the organic EL device may include A region where a pixel electrode and a driving thin film transistor are formed on a transparent insulating substrate 10, B region where a common power supply line is wired, and C region where a capacitor is formed.

A buffer layer 15 is formed on the insulating substrate 10, and a driving thin film transistor including a semiconductor layer 20 having source/drain regions 21 and 22 and a channel region 23, a gate electrode 31, and source/drain electrodes 51 and 52 connected to the source/drain regions 21 and 22 through contact holes 41 and 42, is formed in a region above the buffer layer 15 in the A region, and a capacitor comprised of a first electrode 32 and a second electrode 53 is formed in the C region.

A gate insulating layer 30 is formed between the semiconductor layer 20, and a gate electrode 31 and a first electrode 32. An interlayer insulating layer 40 is formed between the gate electrode 31 and the first electrode 32, and source/drain electrodes 51, 52 and a second electrode 53. Then a passivation layer 60 is formed.

A pixel electrode 70 is formed as an anode electrode on the passivation layer 60, and is connected to one of the source/drain electrodes 51 and 52, for example, to the drain electrode 52 through the via hole 61, and a planarizing layer 80 having an opening 81 for exposing some portion of the pixel electrode 70 may be formed on the passivation layer 60 including the pixel electrode 70.

An organic light-emitting layer 90 may be formed on the opening 81, and a cathode electrode 95 may be formed on the organic light-emitting layer 90.

As shown in FIG. 2A, the organic EL device comprises a plurality of signal lines, namely, a gate line 35 for applying a scanning signal, a data line 55 for applying a data signal, and a common power supply line 54 for applying a common voltage Vdd to all pixels to provide a reference voltage necessary for driving the driving thin film transistor.

Pixels may be arranged per pixel region defined by these signal lines 35, 54, and 55, wherein each pixel may be comprised of a plurality of thin film transistors connected to those signal lines, one capacitor, and an organic EL device.

In the conventional organic EL device, the gate line 35 and the first electrode 32 of the capacitor may be formed when the gate electrode 31 may be formed, and the data line 55, the power supply line 54, and a second electrode 53 of the capacitor may be formed when the source/drain electrodes 51 and 52 may be formed. In this case, the second electrode 53 of the capacitor and one of the source/drain electrodes 51 and 52 have structures extended from the common power supply line 54. In other words, the common power supply line 54 may be concurrently formed while the source/drain electrodes 51 and 52 are formed.

The common power supply line 54 in the light emitting region 100 may also be stacked in the same manner as the non-light emitting region 200 of the periphery of the panel, which causes the panel size to be increased due to wiring width of the common power supply line 54.

SUMMARY OF THE INVENTION

The present invention provides a flat panel display having a wiring structure of a power supply line capable of maintaining wiring resistance of the conventional structure while reducing the width of the power supply line. Note that, as used herein, the term "curved" does not require a smooth transition, but is rather to be viewed in contrast to shapes that are substantially straight for long distances. For example, layer 54 is straight in FIG. 1B and curved in FIG. 4B, although that particular curvature is just one example.

In an exemplary embodiment of the present invention, there may be provided a flat panel display device, which may include a light-emitting layer portion having a first electrode, a second electrode, and an organic light-emitting layer between the first and second electrodes; at least two thin film transistors for controlling the light-emitting layer portion; a scanning signal line for supplying a scanning signal to the thin film transistor; a data signal line for supplying a data signal to the thin film transistor; a light emitting region having a common power supply line for supplying current to the light-emitting layer portion; and a peripheral common power supply line connected to the common power supply line and having at least one curved portion on a non-light emitting region except the light emitting region.

In another exemplary embodiment of the present invention, there may be provided a flat panel display device, which may include an insulating substrate; a buffer layer formed on the entire surface of the insulating substrate; a gate insulating layer formed above the buffer layer; an interlayer insulating layer formed above the gate insulating layer and patterned to be curved; and a common power supply line formed above the interlayer insulating layer.

BRIEF DESCRIPTION OF THE DRAWINGS

The above and other features of the present invention will be described in reference to certain exemplary embodiments thereof with reference to the attached drawings.

FIG. 5A is a cross-sectional view taken along the line II-II of FIG. 2A for showing a stacked structure of a flat panel display device in accordance with a third exemplary embodiment of the present invention.

DETAILED DESCRIPTION OF THE INVENTION

Figure 1A:
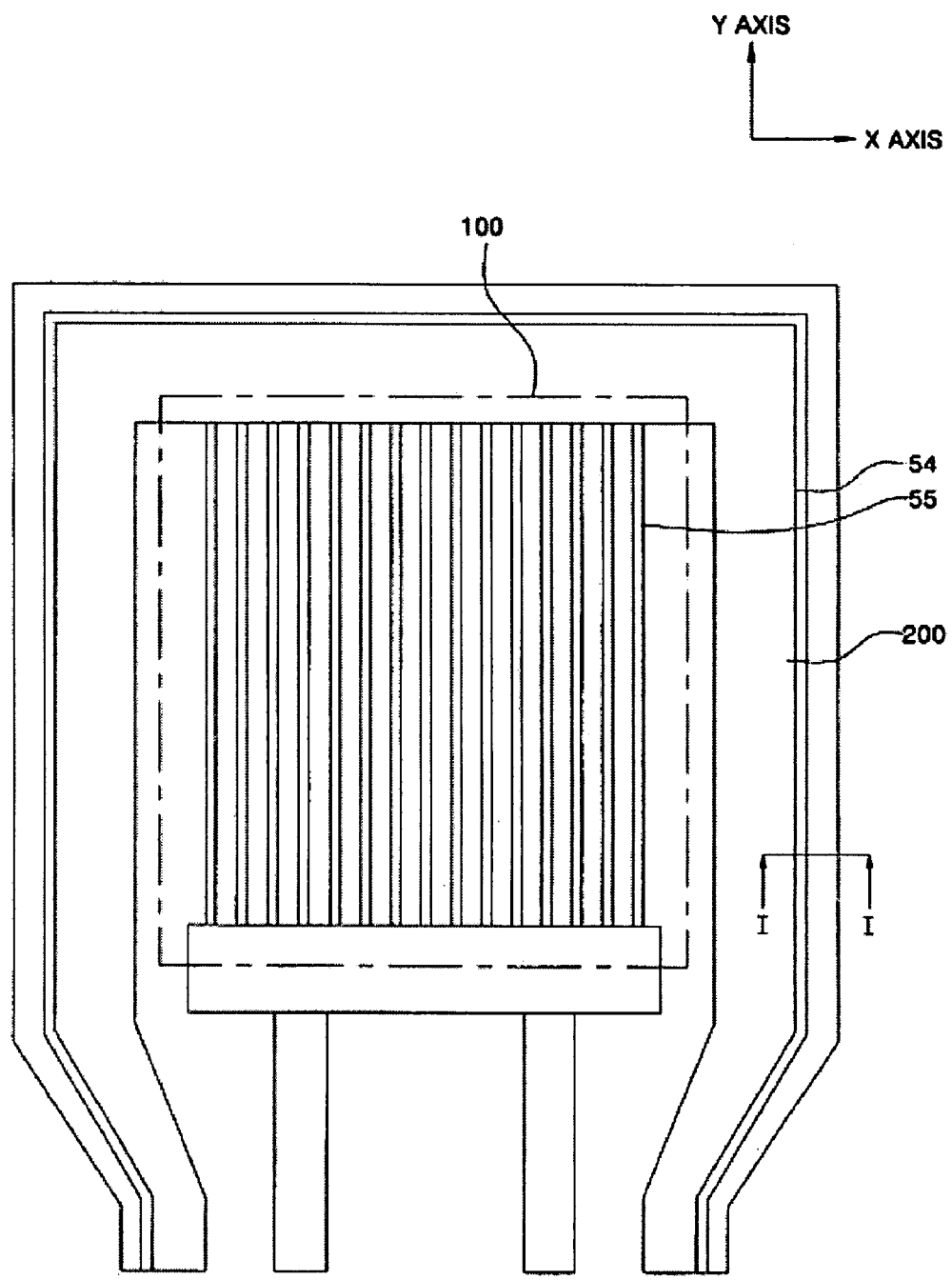
FIG. 1A is a schematic plan view of a light emitting region and a non-light emitting region of a conventional organic electroluminescent (EL) device.
Figure 1B:
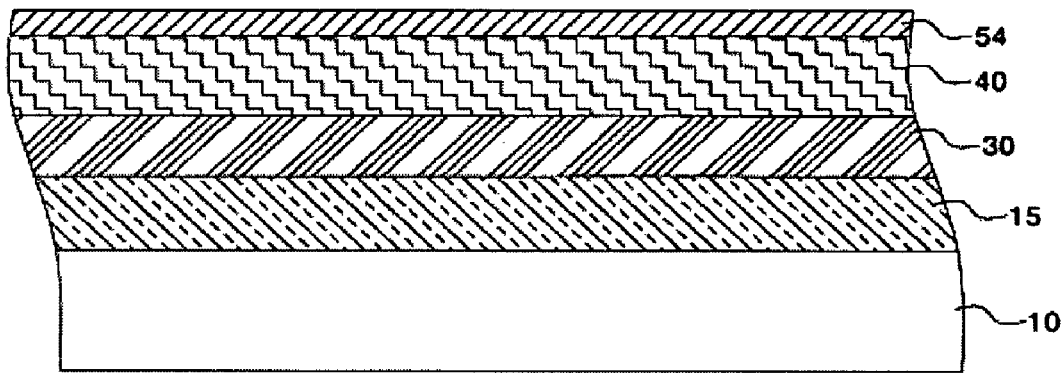
FIG. 1B is a cross-sectional view taken along the line I-I of FIG. 1A for showing a stacked structure of a common power supply line of the conventional organic EL device.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 3:
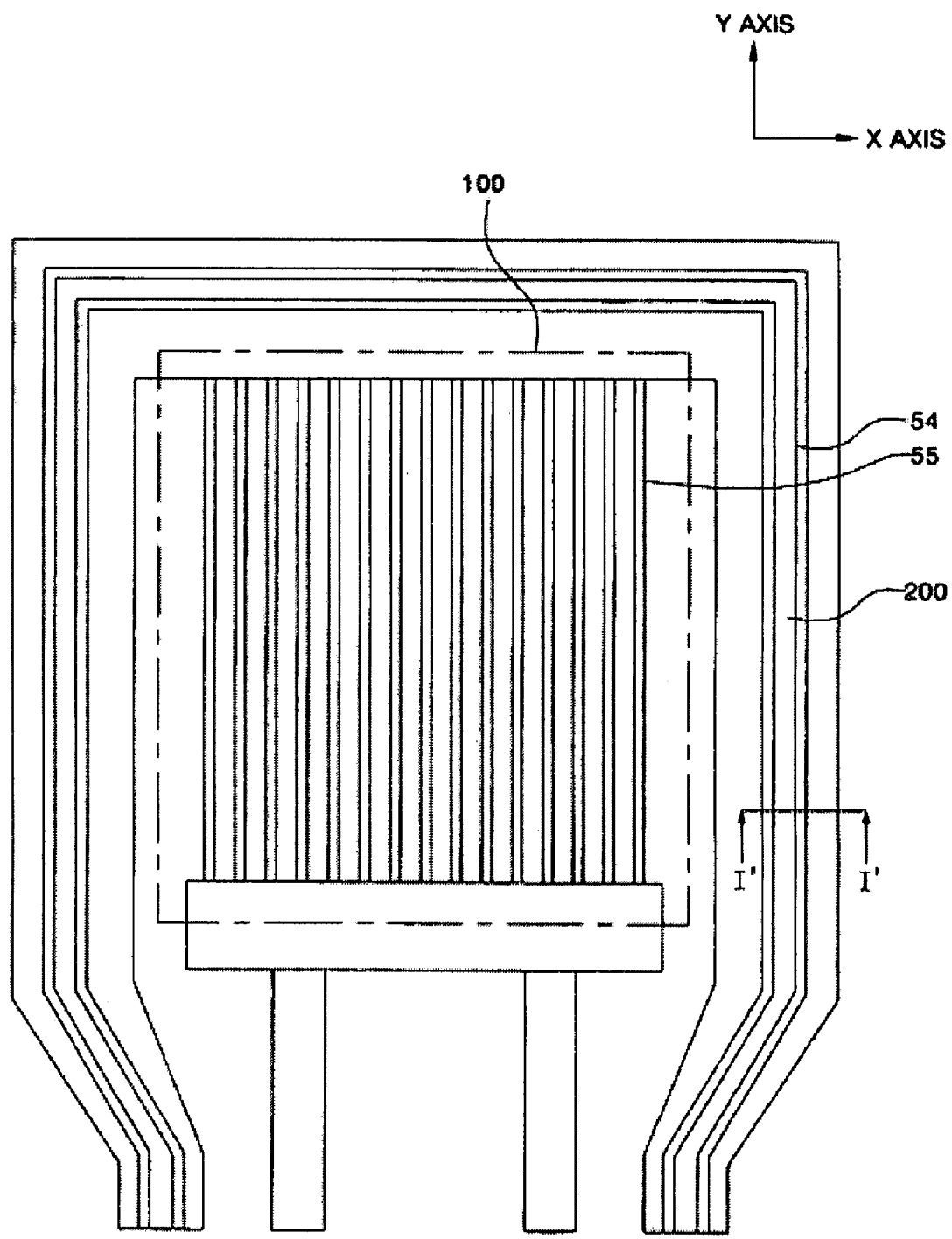
FIG. 3 is a schematic plan view of a light emitting region and a non-light emitting region of an organic EL device in accordance with one exemplary embodiment of the present invention.

FIG. 3 is a schematic plan view of a light emitting region and a non-light emitting region of an organic EL device in accordance with one exemplary embodiment of the present invention.

Figure 4A:
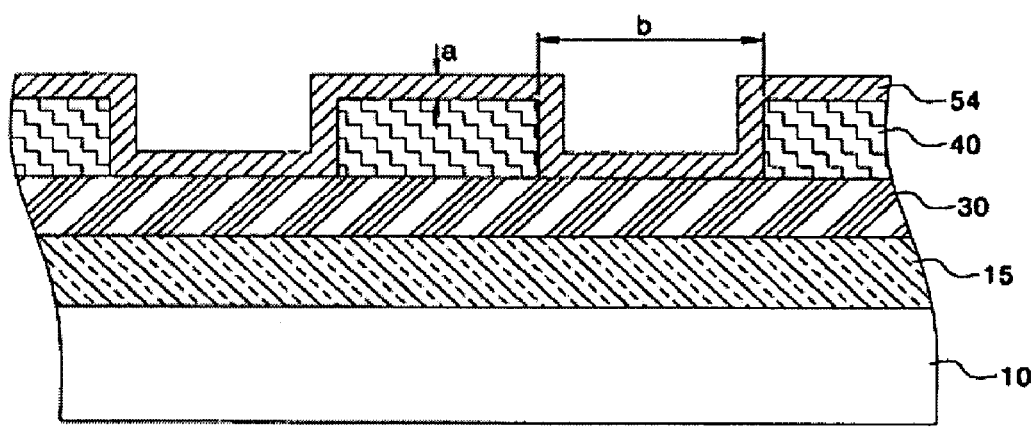
FIG. 4A is a cross-sectional view taken along the line I'-I' of FIG. 3 for showing a stacked structure of a common power supply line of a flat panel display device in accordance with a first exemplary embodiment of the present invention.

FIG. 4A is a cross-sectional view taken along the line I'-I' of FIG. 3 for showing a stacked structure of a common power supply line of a flat panel display in accordance with a first exemplary embodiment of the present invention.

As shown in FIG. 4A, the organic EL device in accordance with the first exemplary embodiment of the present invention comprises a buffer layer 15 formed on the entire surface of a substrate 10, which may be commonly used for a light emitting region 100 and a non-light emitting region 200. A semiconductor layer may then be formed using polycrystalline silicon in the light emitting region 100, and a gate insulating layer 30 may be formed on the entire surface of the substrate.

Next, a gate electrode (not shown) may be formed above the semiconductor layer of the light emitting region 100 on the gate insulating layer 30, and an interlayer insulating layer 40 may be formed on the entire surface of the substrate 10 including the gate electrode. The interlayer insulating layer 40 of the light emitting region 100 may be etched to form first and second contact holes for exposing source/drain regions (not shown), respectively, and the interlayer insulating layer 40 in which a common power supply line 54 may be formed in the non-light emitting region 200 may be concurrently patterned to be curved by etching in a longitudinal direction (namely, y axis of FIG. 3) as shown in FIG. 4A.

In this case, the interlayer insulating layer 40 of the non-light emitting region 200 acts to reduce the wiring width while enabling the common power supply line 54 to maintain a typical wiring resistance, and there should preferably be at least one such curved portion. The curved portion may be preferably uneven, and a distance (b) between curved portions should preferably be at least two times a stacked thickness (a) of the common power supply line 54.

After the interlayer insulating layer 40 may be patterned, a metal electrode material may be deposited and patterned on the entire surface of the substrate 10 to thereby form source/drain electrodes (not shown) to be contacted with the source/drain regions through the first and second contact holes in the thin film transistor of the light emitting region 100, respectively, and the common power supply line 54 extended from one of the source/drain electrodes in the non-light emitting region 200.

In the present embodiment, etching for the interlayer insulating layer 40 of the non-light emitting region 200 where the common power supply line 54 will be formed may be progressed with an etching process for forming the contact holes at the same time, which does not require a mask process and the common power supply line may be formed to have constant curved portions, and when the same wiring resistance may be maintained as unit area through which current flows increases, the wiring width may be reduced compared to that of a conventional wiring structure to thereby reduce the total panel size.

Figure 4B:
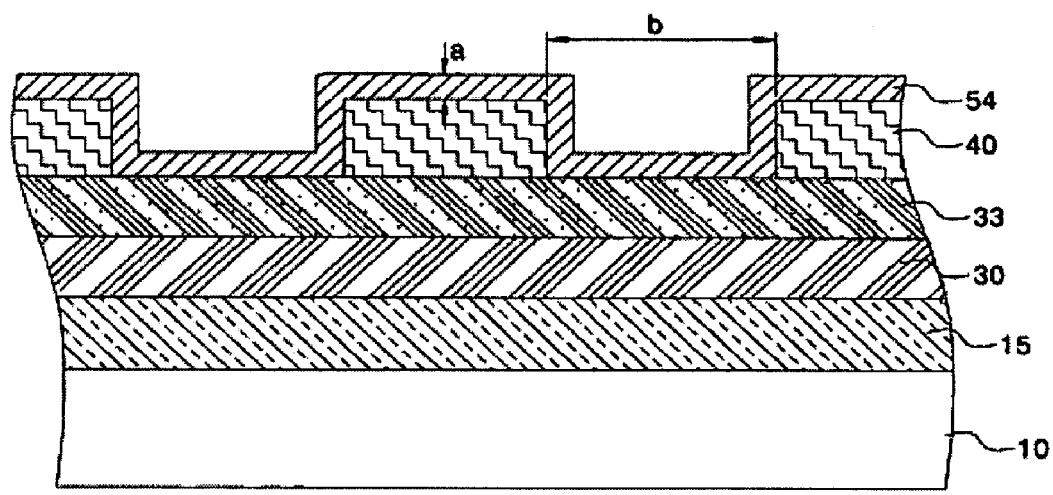
FIG. 4B is a cross-sectional view taken along the line I'-I' of FIG. 3 for showing a stacked structure of a common power supply line of a flat panel display device in accordance with a second exemplary embodiment of the present invention.

FIG. 4B is a cross-sectional view taken along the line I'-I' of FIG. 3 for showing a stacked structure of a common power supply line of a flat panel display in accordance with a second exemplary embodiment of the present invention.

As shown in FIG. 4B, the same method as the first exemplary embodiment may be performed from its start to the process for forming the gate insulating layer.

A gate metal material may also be deposited on a region where the common power supply line 54 of the non-light emitting region 200 will be formed when the gate electrode of the light emitting region 100 is formed. The gate electrode material may be patterned in the light-emitting region 100 to form the gate electrode and the gate electrode material may remain in the non-light emitting region 200.

Next, an interlayer insulating layer 40 may be formed on the entire surface of the substrate 10 on the gate insulating layer 30. The interlayer insulating layer 40 of the light emitting region 100 may be etched to form first and second contact holes for exposing source/drain regions (not shown), respectively while the interlayer insulating layer 40 where the common power supply line 54 will be formed in the non-light emitting region 200 may be concurrently patterned to be curved by etching in a longitudinal direction (namely, y axis direction of FIG. 3) as shown in FIG. 4B.

In this case, the interlayer insulating layer 40 of the non-light emitting region 200 acts to reduce a wiring width while allowing the common power supply line 54 to maintain a typical wiring resistance, and at least one such curved portion should preferably be present. The curved portion may be preferably uneven, and a distance (b) between curved portions should preferably be at least two times a stacked thickness (a) of the common power supply line 54.

After the interlayer insulating layer 40 may be patterned, a metal electrode material may be deposited and patterned on the entire surface of the substrate 10 to thereby form source/drain electrodes (not shown) to be contacted with the source/drain regions through the first and second contact holes in the thin film transistor of the A region, respectively, and the common power supply line 54 extended from one of the source/drain electrodes in the non-light emitting region 200 at the same time. In this case, the lower curved portion of the common power supply line 54 in the non-light emitting region 200 may be contacted with a gate metal material, namely, an auxiliary common power supply line 33.

As a result, in accordance with the common power supply line 54 of the non-light emitting region 200 in the second exemplary embodiment, metal wiring has a double-wiring structure to thereby increase the width through which current may flow, which leads to the reduction of the width of the metal wiring compared to that of a conventional common power supply line when the same wiring resistance may be maintained.

Figure 2A:
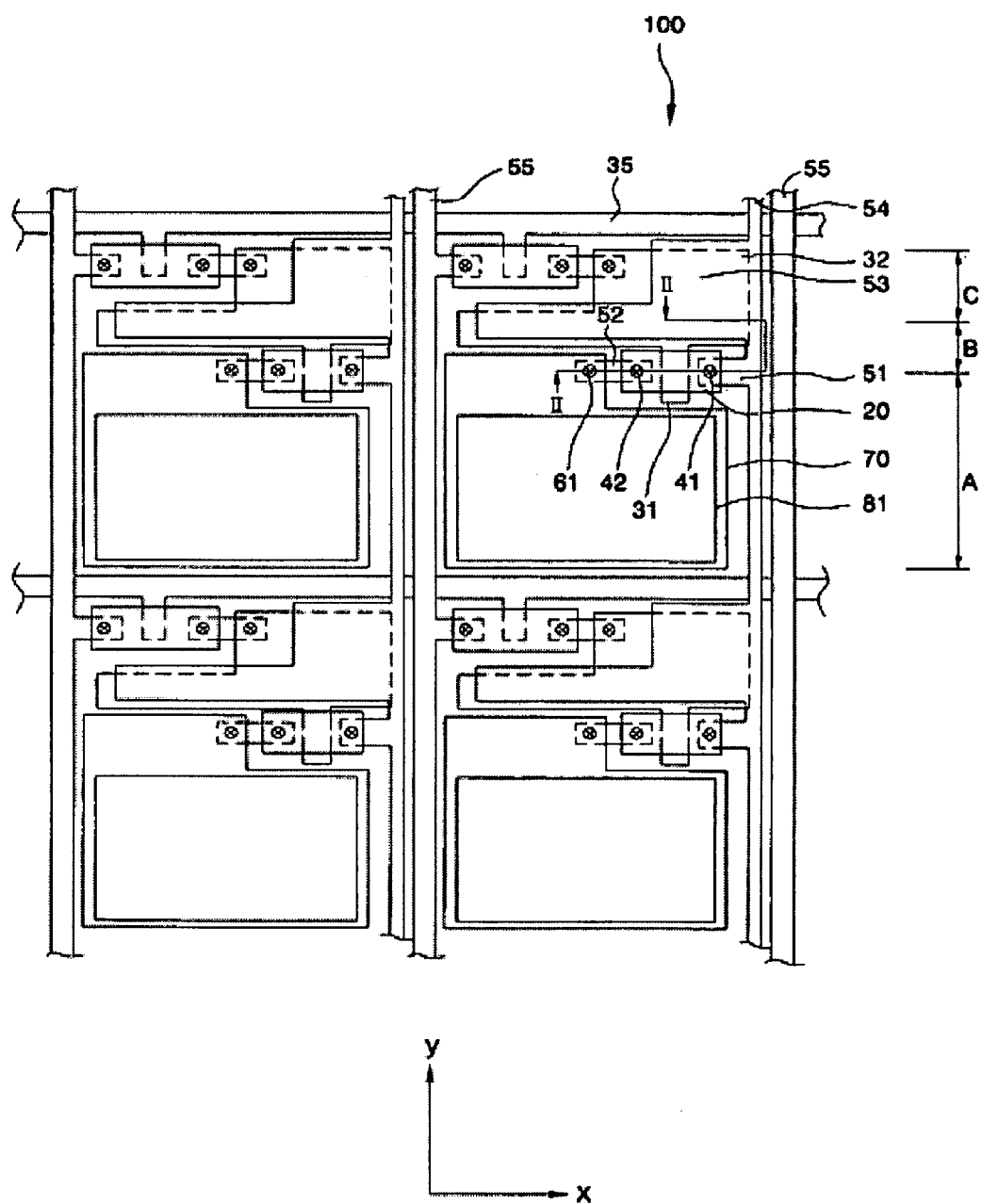
FIG. 2A is a plan view for showing a plan structure of the light emitting region of the organic EL device of FIG. 1A.
Figure 2B:
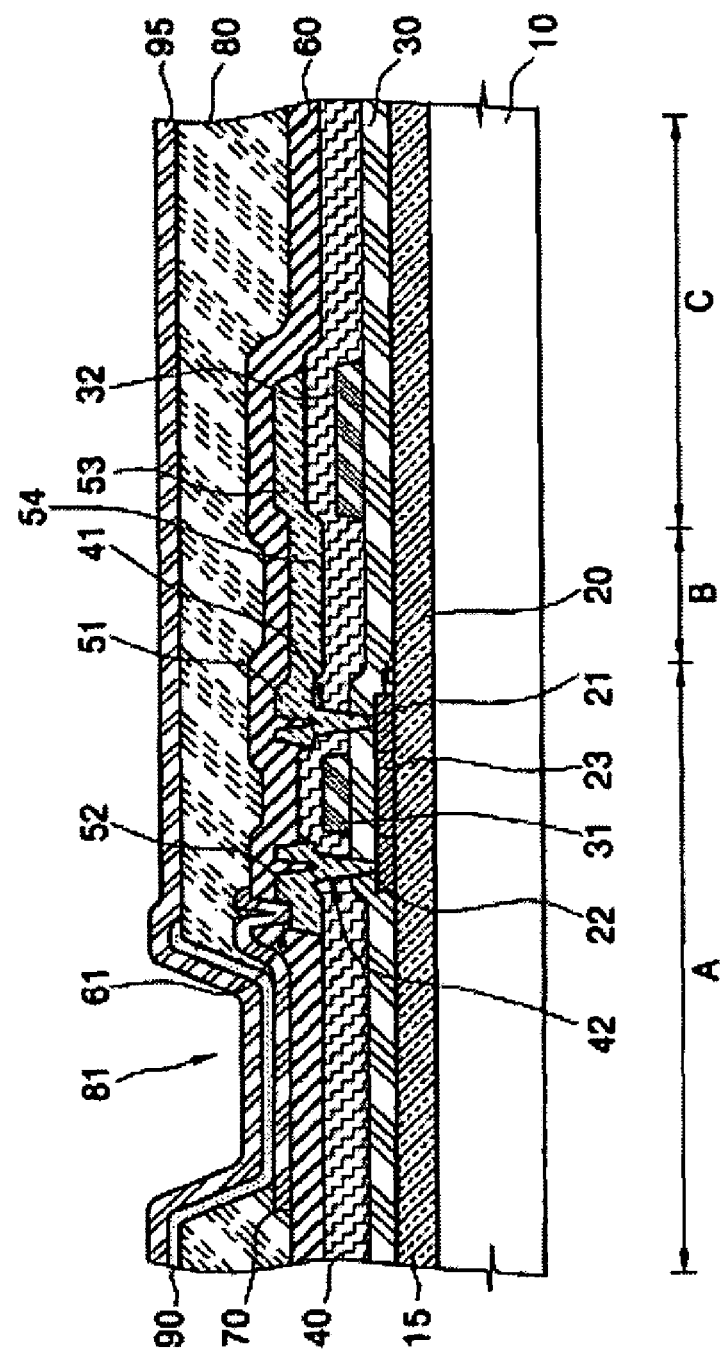
FIG. 2B is a cross-sectional view taken along the line II-II of FIG. 2A.

FIG. 5A is a cross-sectional view taken along the line II-II of FIG. 2A for showing a stacked structure of a flat panel display device in accordance with a third exemplary embodiment of the present invention.

As shown in FIG. 5A, an insulating substrate 10 including A region where a pixel electrode and a thin film transistor are formed, B region where a common power supply line may be arranged, and C region where a capacitor is formed may be prepared. A buffer layer 15 may be formed on the insulating substrate 10.

A semiconductor layer 20 may then be formed on a portion where the thin film transistor will be formed in the A region, and a gate insulating layer 30 is formed on the entire surface of the substrate 10 including the semiconductor layer 20. A gate electrode 31 may then be formed on the gate insulating layer 30 above the semiconductor layer 20 of the A region, and a first electrode 32 of the capacitor may be formed on the gate insulating layer 30 where the capacitor of the C region will be formed. One of n type and p type impurities, for example, p type impurities may be implanted into the semiconductor layer 20 to form source/drain regions 21 and 22, and a portion of the semiconductor layer 20 below the gate electrode 31 acts as a channel region 23.

An interlayer insulating layer 40 may be formed on the entire surface of the substrate 10 on the gate insulating layer 30 where the gate electrode 31 and the first electrode 32 of the capacitor may be already formed. The interlayer insulating layer 40 of the A region may be etched to form first and second contact holes 41 and 42 for exposing the source/drain regions 21 and 22, respectively, and the interlayer insulating layer 40 of the B region where the common power supply line 54 will be formed may be concurrently patterned to be curved by etching in a longitudinal direction (namely, y axis of FIG. 2A) as shown in FIG. 5A.

In this case, the interlayer insulating layer 40 of the B region acts to reduce a wiring width while allowing the common power supply line 54 to maintain a typical wiring resistance, and at least one such curved portion should preferably be present. The curved portion may be preferably uneven, and a distance (b) between curved portions should preferably be at least two times a stacked thickness (a) of the common power supply line 54.

After the interlayer insulating layer may be patterned, a metal electrode material may be deposited and patterned on the entire surface of the substrate to thereby form source/drain electrodes 51 and 52 to be contacted with the source/drain regions 21 and 22 through the first and second contact holes 41 and 42 in the thin film transistor of the A region, respectively, and a common power supply line extended from one of the source/drain electrodes 51 and 52 above the B region at the same time. In the meantime, one of the source/drain electrodes 51 and 52 may be extended to form a second electrode 53 of the capacitor in the C region.

A driving thin film transistor of a pixel region of the flat panel display device in accordance with the present invention, may be supplied with power when one of the source/drain electrodes and the second electrode of the capacitor is connected to the common power supply line.

In the present embodiment, etching for the interlayer insulating layer of the B region where the common power supply line will be formed may be progressed with an etching process for forming the contact holes at the same time, which does not require a mask process and the power supply line may be formed to have constant curved portions, and when the same wiring resistance may be maintained as unit area through which current flows increases, the wiring width may be reduced compared to that of a conventional wiring structure to thereby reduce the total panel size.

Figure 5B:
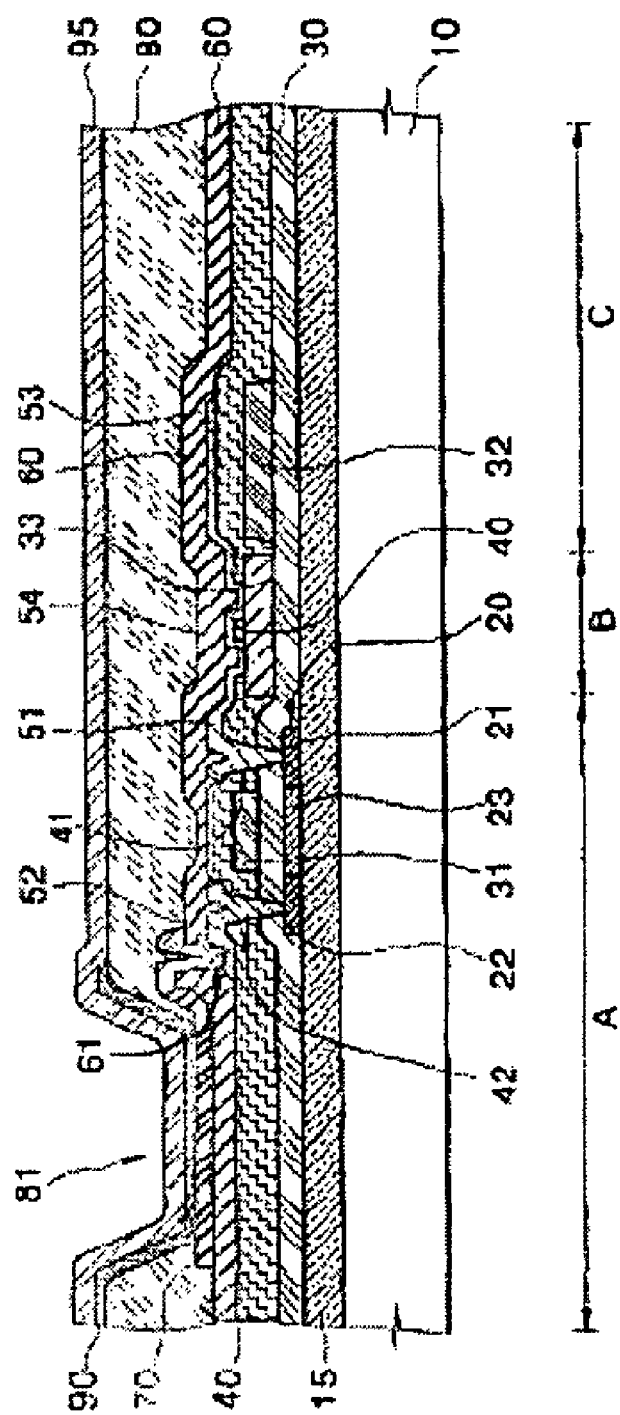
FIG. 5B is a cross-sectional view taken along the II-II line for showing a stacked structure of a flat panel display device in accordance with a fourth exemplary embodiment of the present invention.

FIG. 5B is a cross-sectional view taken along the II-II line for showing a stacked structure of a flat panel display device in accordance with a fourth exemplary embodiment of the present invention.

As shown in FIG. 5B, the same method as the third exemplary embodiment may be performed from its start to the process for forming the gate insulating layer in the fourth exemplary embodiment.

A gate metal material may also be deposited on a region where the common power supply line 54 of the B region will be formed when the gate electrode 31 may be formed. The gate electrode material may be patterned to form the gate electrode 31 and a first electrode 32 of the capacitor, and the gate electrode material may remain on the B region.

One of n type and p type impurities, for example, p type impurities may then be implanted into the semiconductor layer 20 to form source/drain regions 21 and 22, and a portion of the semiconductor layer 20 below the gate electrode 31 acts as a channel region 23.

An interlayer insulating layer 40 may be formed on the entire surface of the substrate 10 on the gate insulating layer 30 where the gate electrode 31 and the first electrode 32 of the capacitor may be already formed. The interlayer insulating layer 40 of the A region may be etched to form first and second contact holes 41 and 42 for exposing the source/drain regions 21 and 22, respectively, and the interlayer insulating layer 40 of the B region where the common power supply line 54 will be formed may be concurrently patterned to be curved by etching in a longitudinal direction (namely, y axis of FIG. 2A) as shown in FIG. 5B.

In this case, the interlayer insulating layer 40 of the B region acts to reduce a wiring width while allowing the common power supply line 54 to maintain a typical wiring resistance, and at least one such curved portion should preferably be present. The curved portion may be preferably uneven, and a distance (b) between curved portions should preferably be at least two times a stacked thickness (a) of the common power supply line 54.

After the interlayer insulating layer 40 may be patterned, a metal electrode material may be deposited and patterned on the entire surface of the substrate 10 to thereby form source/drain electrodes 51 and 52 to be contacted with source/drain regions 21 and 22 through the first and second contact holes 41 and 42 in the thin film transistor of the A region, respectively, and a common power supply line 54 extended from one of the source/drain electrodes 51 and 52 above the B region at the same time. In the meantime, one of the source/drain electrodes 51 and 52 may be extended to form a second electrode 53 of the capacitor in the C region. In this case, the lower curved portion of the common power supply line 54 in the B region may be contacted with a gate metal material, namely an auxiliary common power supply line 33.

As a result, in accordance with the common power supply line of the B region in the fourth exemplary embodiment, metal wiring becomes a double-wiring structure to thereby increase the width through which current may flow, which leads to the reduction of the width of metal wiring compared to that of a conventional common power supply line when the same wiring resistance may be maintained.

In the meantime, it has been described that the common power supply line 54 of the light emitting region 100 and the common power supply line 54 of the non-light emitting region 200 are separately shaped to be curved in the exemplary embodiments of the present invention, however, the common power supply line 54 of the light emitting region 100 and the common power supply line 54 of the non-light emitting region 200 may be formed to be curved at the same time.

The flat panel display device employed in the present invention may include, but not limited to, an organic light emitting diode or a liquid crystal display device.

As mentioned above, the common power supply line may be formed to have its wiring structure curved or to have a double-wiring structure of the common power supply line, which allows the wiring width to be reduced when the same wiring resistance may be maintained, and also allows IR drop due to the wiring resistance to be minimized. In addition, the wiring width may be reduced to thereby reduce the total panel size of the flat panel display. It is understood that the disclosure has been made for purpose of illustrating the invention by way of examples and is not limited to limit the scope of the invention. And one skilled in the art can make amend and change the present invention without departing from the scope and spirit of the invention.

What is claimed is:

1. A flat panel display device, comprising:
a light-emitting portion having a first electrode, a second electrode, and an organic light-emitting layer between the first and second electrodes;
at least two thin film transistors to control the light-emitting portion;
a scanning signal line to supply a scanning signal to one of the at least two thin film transistors;
a data signal line to supply a data signal to one of the at least two thin film transistors;
a light emitting region having a common power supply line to supply current to the light-emitting portion; and
a peripheral common power supply line connected to the common power supply line and having at least one non-flat portion on a non-light emitting region.

2. The flat panel display device as claimed in claim 1, wherein the non-flat portion is uneven.

3. The flat panel display device as claimed in claim 1, wherein a width between non-flat portions is at least two times a stacked thickness of the common power supply line.

4. The flat panel display device as claimed in claim 1, wherein the non-flat portion is formed in a longitudinal direction of the common power supply line.

5. The flat panel display device as claimed in claim 1, wherein the flat panel display device is a device selected from the group consisting of a liquid crystal display device (LCD), an organic light emitting device (OLED), and a hybrid of LCD and OLED.

6. The flat panel display device as claimed in claim 1, wherein the common power supply line of the light emitting region has at least one non-flat portion.

7. The flat panel display device as claimed in claim 6, wherein the non-flat portion of the common power supply line is uneven.

8. A flat panel display device, comprising:
a substrate comprising a light emitting region and a non-light emitting region outside the light emitting region;
a buffer layer formed on an entire surface of the substrate;
a gate insulating layer formed above the buffer layer;
an interlayer insulating layer formed above the gate insulating layer and patterned to be non-flat in the non-light emitting region; and
a common power supply line formed above the non-flat interlayer insulating layer and connected to a thin film transistor.

9. The flat panel display device as claimed in claim 8, wherein the non-flat portion is uneven.

10. The flat panel display device as claimed in claim 8, wherein a width between non-flat portions is at least two times a stacked thickness of the common power supply line.

11. The flat panel display device as claimed in claim 8, wherein the non-flat portion is formed in a longitudinal direction of the common power supply line.

12. The flat panel display device as claimed in claim 8, wherein the flat panel display device is a device selected from the group consisting of a liquid crystal display device (LCD), an organic light emitting device (OLED), and a hybrid of LCD and OLED.

13. The flat panel display device of claim 1, wherein the non-flat portion comprises a curved portion.

14. The flat panel display device of claim 8, wherein the non-flat portion comprises a curved portion.

15. The flat panel display device as claimed in claim 1, wherein the peripheral common power supply line contacts an auxiliary common power supply line.

16. The flat panel display device as claimed in claim 8, wherein the common power supply line contacts an auxiliary common power supply line.

17. The flat panel display device as claimed in claim 8, wherein the common power supply line contacts the gate insulating layer.

* * * * *